(12) United States Patent
Martini

(10) Patent No.: US 10,673,422 B2
(45) Date of Patent: Jun. 2, 2020

(54) METHOD, CIRCUIT, AND APPARATUS TO INCREASE ROBUSTNESS TO INRUSH CURRENT IN POWER SWITCH DEVICES

(71) Applicant: STMicroelectronics S.r.l., Agrate Brianza (MB) (IT)

(72) Inventor: Marco Martini, Acireale (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/254,839

(22) Filed: Jan. 23, 2019

(65) Prior Publication Data

US 2019/0158074 A1 May 23, 2019

Related U.S. Application Data

(63) Continuation of application No. 15/704,094, filed on Sep. 14, 2017, now Pat. No. 10,230,358.

(51) Int. Cl.
| | |
|---|---|
| G05F 1/46 | (2006.01) |
| H03K 4/02 | (2006.01) |
| H02M 3/07 | (2006.01) |
| H02M 1/32 | (2007.01) |
| H02M 1/36 | (2007.01) |
| H03K 4/50 | (2006.01) |

(52) U.S. Cl.
CPC .............. *H03K 4/023* (2013.01); *H02M 1/32* (2013.01); *H02M 1/36* (2013.01); *H02M 3/07* (2013.01); *G05F 1/461* (2013.01); *H03K 4/50* (2013.01)

(58) Field of Classification Search
CPC ........... H02M 1/36; G05F 1/461; G05F 1/468
USPC ......................................... 323/244, 288, 326
See application file for complete search history.

(56) References Cited

U.S. PATENT DOCUMENTS

| | | |
|---|---|---|
| 4,716,510 A | 12/1987 | Pace et al. |
| 5,610,503 A | 3/1997 | Fogg et al. |
| 7,157,892 B1 | 1/2007 | Ritter |
| 10,186,967 B2 * | 1/2019 | Huang .................. H02M 3/158 |
| 10,230,358 B1 | 3/2019 | Martini |
| 2007/0090817 A1 | 4/2007 | Yee |
| 2007/0120544 A1 | 5/2007 | Ritter |
| 2009/0185397 A1 | 7/2009 | Forghani-zadeh et al. |
| 2010/0033152 A1 * | 2/2010 | Chen ..................... H02M 3/158 323/288 |
| 2013/0200873 A1 | 8/2013 | Wu |

(Continued)

FOREIGN PATENT DOCUMENTS

CN 208835738 U 5/2019

*Primary Examiner* — Alex Torres-Rivera
(74) *Attorney, Agent, or Firm* — Slater Matsil, LLP

(57) ABSTRACT

In accordance with an embodiment, a method includes receiving an enable signal. After the enable signal is asserted, it is determined whether a soft-start capacitor is electrically connected to an input of a ramp generator circuit while keeping an output of the ramp generator circuit low. If the soft-start capacitor is electrically connected to the input of the ramp generator circuit, a first current is injected into the input of the ramp generator circuit to generate a first voltage ramp at the output of the ramp generator circuit. If the soft-start capacitor is not electrically connected to the input of the ramp generator circuit, a second current is injected to the input of the ramp generator circuit to generate a second voltage ramp at the output of the ramp generator circuit. The second current is smaller than the first current.

21 Claims, 9 Drawing Sheets

(56) References Cited

U.S. PATENT DOCUMENTS

| | | |
|---|---|---|
| 2014/0217999 A1 | 8/2014 | Wibben et al. |
| 2015/0008955 A1 | 1/2015 | Kwon et al. |
| 2015/0256060 A1 | 9/2015 | Faingersh et al. |
| 2016/0329807 A1 | 11/2016 | Daly |
| 2017/0338807 A1* | 11/2017 | Zhu .................. H03K 4/50 |

* cited by examiner

METHOD, CIRCUIT, AND APPARATUS TO INCREASE ROBUSTNESS TO INRUSH CURRENT IN POWER SWITCH DEVICES

CROSS-REFERENCE TO RELATED APPLICATIONS

This application is a continuation of U.S. patent application Ser. No. 15/704,094, filed on Sep. 14, 2017, which application is hereby incorporated herein by reference.

TECHNICAL FIELD

The present invention relates generally to an electronic circuit, and, in particular embodiments, to a method to increase robustness to inrush current in power switch devices.

BACKGROUND

Electronic circuits in general are typically designed to operate in a particular operating range. For example, a switch-mode power supply (SMPS) may be designed to receive 12 V and generate an output voltage of 3.3 V capable of supplying 1 A to a load.

Some systems may have power-up requirements for proper operation. For example, a processor may have multiple supply inputs, and the processor may be designed to have a particular supply input having a voltage that is always higher than another supply input for proper operation. Similarly, an electronic device may be designed to have a supply input increase its voltage at a particular rate during a power-up event for proper operation.

Exceeding some of the specifications of an electronic device may cause temporal malfunction or permanent damage to the electronic device or other devices coupled to the electronic device. For example, shorting an output of an SMPS to ground may cause an overcurrent event that cause permanent damage to the SMPS (e.g., to one or more power FETs), and, in some case, even to the PCB and PCB traces. As another example, in some cases, abruptly turning on a power supply may cause an in-rush current that may cause temporal or permanent damage to the power supply and/or to components coupled to the power supply.

Fuses have been used to protect electronic devices, such as power sources, loads, cables, wiring systems, electrical equipment, and other electrical components from an over-current event. A fuse is typically a low resistance element that would interrupt the flow of current through it when current beyond the fuse's current rating flows through it.

An electronic fuse (e-fuse) is an active circuit that provides over-current protection.

SUMMARY

In accordance with an embodiment, a method includes receiving an enable signal. After the enable signal is asserted, it is determined whether a soft-start capacitor is electrically connected to an input of a ramp generator circuit while keeping an output of the ramp generator circuit low. If the soft-start capacitor is electrically connected to the input of the ramp generator circuit, a first current is injected into the input of the ramp generator circuit to generate a first voltage ramp at the output of the ramp generator circuit. If the soft-start capacitor is not electrically connected to the input of the ramp generator circuit, a second current is injected to the input of the ramp generator circuit to generate a second voltage ramp at the output of the ramp generator circuit. The second current is smaller than the first current.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b shows waveforms during a typical power-up of the soft-start circuit of FIG. 1a;

FIGS. 3b and 3c show waveforms of the ramp generator of FIG. 3a when a soft-start capacitor is properly connected or disconnected, respectively, according to an embodiment of the present invention;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to preferred embodiments in a specific context, an e-fuse having a soft-start circuit. Embodiments of the present invention may be used in other circuits, such as power management integrated circuits (PMICs) as well as in other circuits implementing a soft-start circuit.

In an embodiment of the present invention, an e-fuse having a soft-start circuit determines whether a soft-start capacitor is operating properly. If the soft-start capacitor is operating properly, the e-fuse turns on with a normal soft-start. If the soft-start capacitor is malfunctioning or not present, the e-fuse turns on with a safety soft-start. The safety soft-start may reduce or eliminate an overcurrent event that may be caused by an in-rush current during power-up when the soft-start capacitor is malfunctioning or not present. Some embodiments include a ramp generator configured to control the soft-start.

Figure 1A:
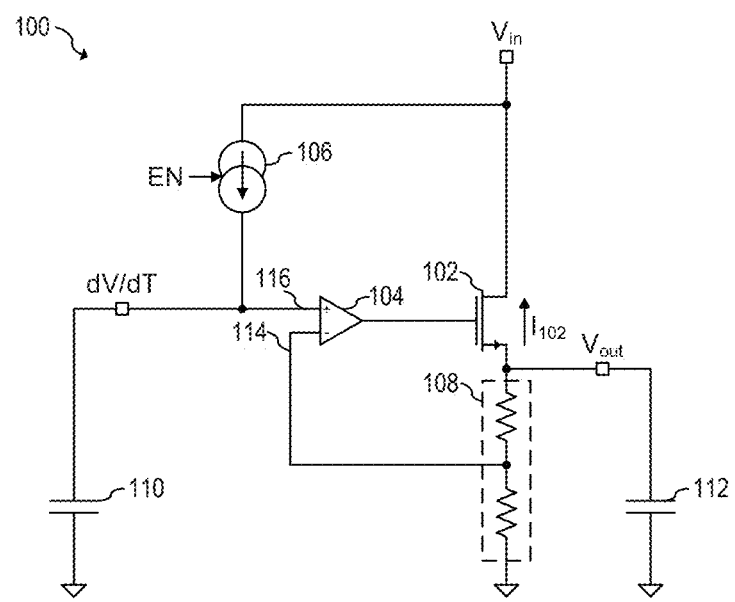
FIG. 1a shows an schematic diagram of an exemplary soft-start circuit.

Some electronic devices, such as, for example, e-fuses and PMICs, are configured to limit in-rush current. For example, the in-rush current during the power-up phase of a device may be controller by having a soft-start. To control in-rush current using soft-start, a circuit is typically coupled in series with a supply input. FIG. 1a shows a schematic diagram of exemplary soft-start circuit 100. Soft-start circuit 100 includes power transistor 102, amplifier 104, current source 106, voltage divider 108 and capacitors 110 and 112.

When power is applied to input $V_{in}$, enable signal EN is typically not asserted (e.g., low). Current source 106, therefore, is off, a control terminal of power transistor 102 is low, and output $V_{out}$ is disconnected from input $V_{in}$. Enable signal EN is typically asserted after a voltage of input $V_{in}$ is settled.

When enable signal EN is asserted (e.g., high), current source 106 turns on and charges soft-start capacitor 110. A voltage at terminal dV/dT, therefore, ramps up. Amplifier 104 controls the voltage at the control terminal of power transistor 102 based on feedback node 114, which is coupled to power transistor 102 via voltage divider 108 in a feedback manner. As the voltage at the control terminal of power transistor 102 increases, the voltage of output $V_{out}$ also increases. When power transistor 102 is fully on, output $V_{out}$ has a voltage substantially similar to input $V_{in}$. A difference in voltage between output $V_{out}$ and input $V_{in}$ may exist, and may be given by $I_{102} \cdot R_{dson}$, where $I_{102}$ is the current flowing through power transistor 102 and $R_{dson}$ is the on resistance of power transistor 102, which is typically small (e.g., less than 100 mΩ).

Figure 1B:
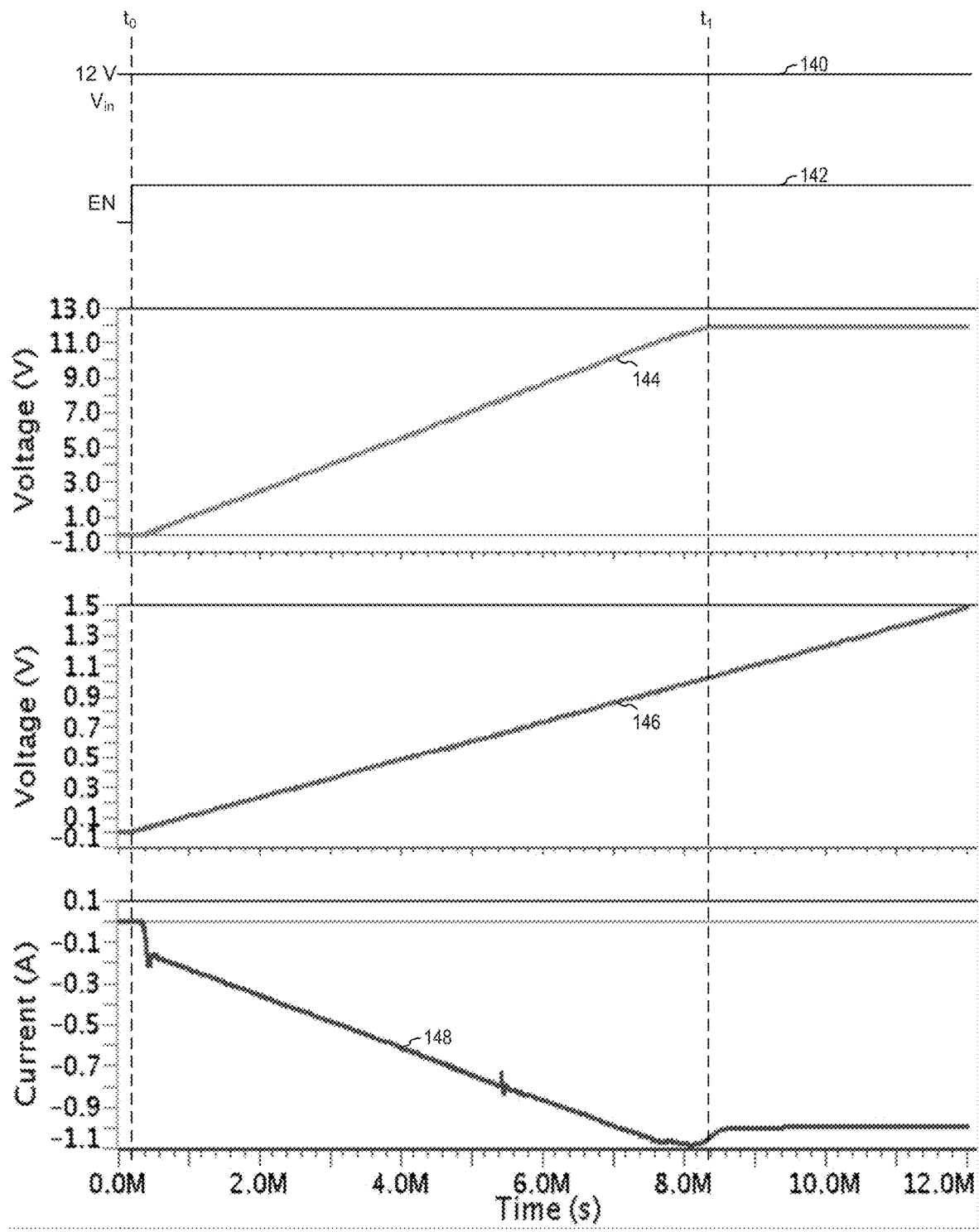

FIG. 1b shows waveforms during a typical power-up of soft-start circuit 100. The waveforms of FIG. 1b may be understood in view of FIG. 1a implemented with soft-start capacitor 110 equal to 80 nF. Curve 140 shows a voltage waveform at input $V_{in}$. Curve 142 shows a voltage waveform of enable signal EN. Curve 144 shows a voltage waveform at output $V_{out}$. Curve 146 shows a voltage waveform at feedback node 114. Curve 148 shows a current waveform of current $I_{102}$.

As shown by curves 142 and 146, when enable signal EN is asserted at time $t_0$, the current injected by current source 106 into soft-start capacitor 110 causes the voltage at terminal dV/dT to slowly increase. The voltage at feedback node 114 tracks the voltage at ramp reference node 116, as shown by curve 146. Amplifier 104, therefore slowly ramps up the voltage at the control node of 102, causing a slow increase in the magnitude of current $I_{102}$, as shown by curve 148. Power transistor 102 is fully on at time $t_1$ (about 8.2 ms after $t_0$ in this example), when the voltage at output $V_{out}$ is substantially similar to the voltage at input $V_{in}$ and current $I_{102}$ settles to 1 A.

Figure 1C:
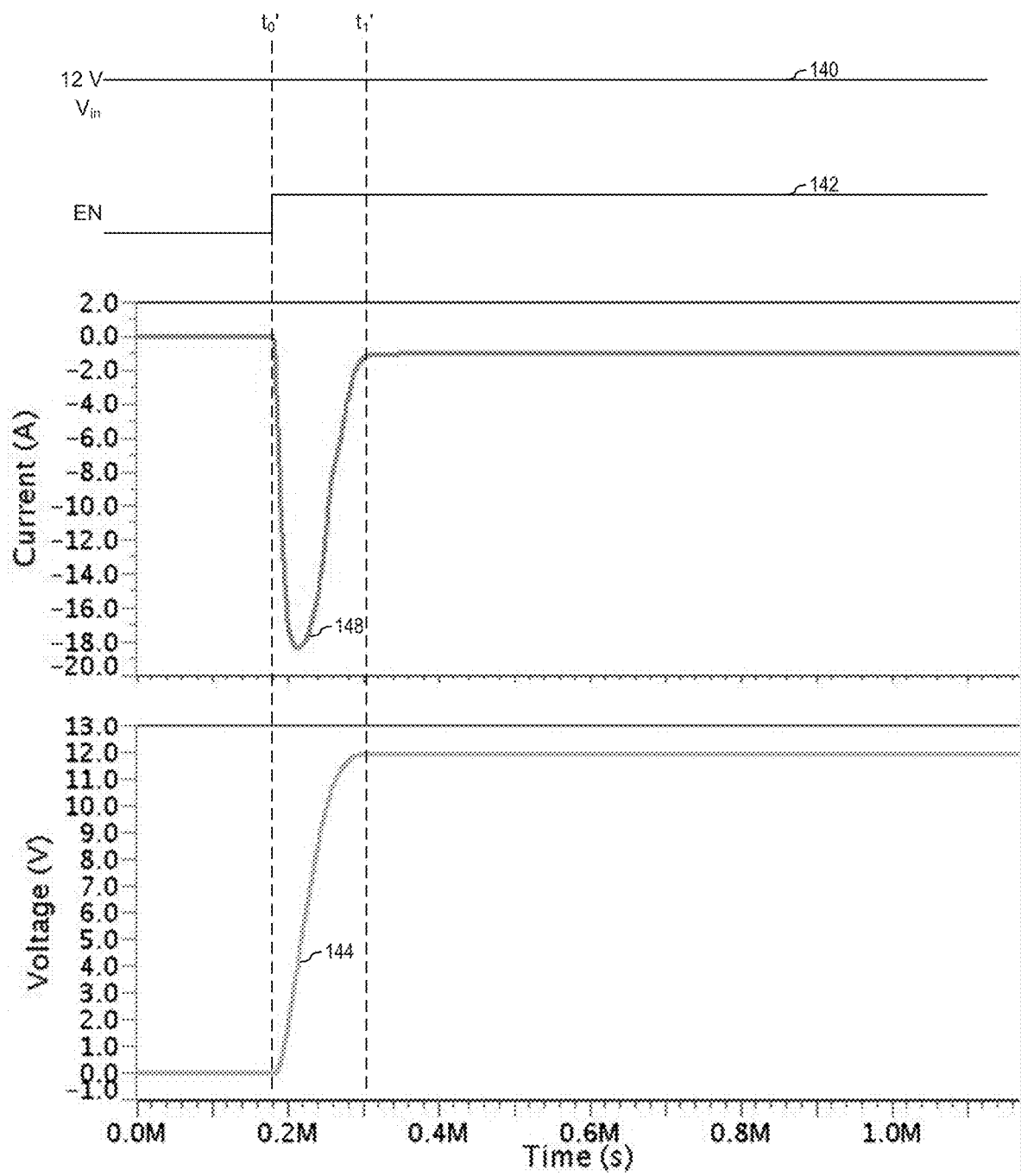
FIG. 1c shows waveforms during a power-up of the soft-start circuit of FIG. 1a without a soft-start capacitor.

In cases where soft-start capacitor 110 is disconnected from soft-start circuit 100 (e.g., not properly soldered), the soft-start may malfunction and a spike of current may be observed. FIG. 1c shows waveforms during a power-up of soft-start circuit 100 without soft-start capacitor 110. As shown in FIG. 1c, without soft-start capacitor 110, when enable signal EN is asserted, current source 106 quickly raises the voltage at terminal dV/dT, thereby causing a rapid turn-on of power transistor 102. Current 102, therefore, exhibits an associated in-rush current spike that has a peak magnitude of 18 A before settling at $t_1'$ at time $t_1'$, which is about 0.3 ms after $t_0'$ in this example, as shown in FIG. 1c.

In some embodiments, a soft-start circuit includes a ramp generator configured to control the soft-start of the soft-start circuit. The ramp generator keeps its output low while checking whether the soft-start capacitor is operating properly. The ramp generator then determines whether the capacitor is connected and has at least a minimum capacitance. If the capacitor is connected with at least the minimum capacitance, the ramp generator generates a normal voltage ramp that produces a normal soft-start. If the capacitor is disconnected or has less capacitance than the minimum capacitance, the ramp generator generates a safety voltage ramp that produces a safety soft-start.

Figure 2A:
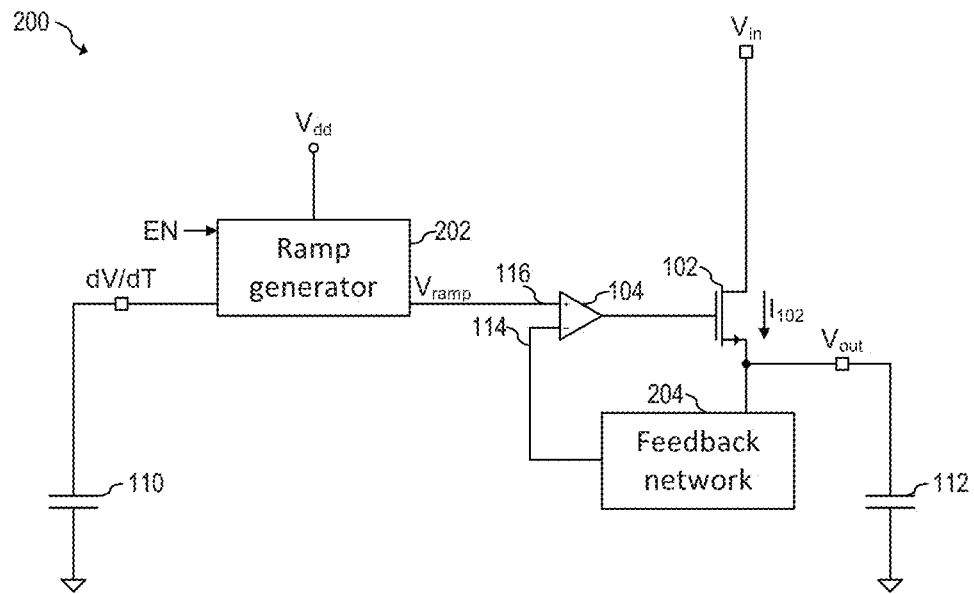
FIG. 2a shows a schematic diagram of a soft-start circuit, according to an embodiment of the present invention.

FIG. 2a shows a schematic diagram of exemplary soft-start circuit 200, according to an embodiment of the present invention. Soft-start circuit 200 includes power transistor 102, amplifier 104, ramp generator 202, feedback network 204, and capacitors 110 and 112.

During normal operation, soft-start circuit 200 operates in a similar manner than soft-start circuit 100. Soft-start circuit 200, however, uses ramp generator 202 to generate a voltage ramp at ramp node 116 instead of using current source 106.

After the voltage at input $V_{in}$ is settled and after enable signal EN is asserted, ramp generator 202 keeps ramp reference node 116 low while determining whether soft-start capacitor 110 is operating properly. If ramp generator 202 determines that capacitor 110 is operating properly, ramp generator may generate a ramp at ramp reference node 116 by injecting a current into soft-start capacitor 110 in a similar manner as in soft-start circuit 100. If ramp generator 202 determines that soft-start capacitor 110 is not operating properly, ramp generator 202 may generate a ramp at ramp reference node 116 by pulling up ramp reference node 116 with a safe current, where the safe current is smaller than the injected current.

Ramp generator 202 may determine whether soft-start capacitor 110 is operating properly by determining whether soft-start capacitor 110 is disconnected. Ramp generator 202 may also determine whether soft-start capacitor 110 has at least a minimum predetermined capacitance.

Ramp generator 202 may receive power at supply $V_{dd}$ directly from input $V_{in}$. In some embodiments, ramp generator 202 may receive power from a voltage regulator (not shown).

Feedback network 204 may be implemented with a voltage divider, for example, similar to voltage divider 106. Alternatively, feedback network 204 may be implemented by directly sensing the voltage at output $V_{out}$. Other implementations are also possible.

Power transistor 102 may be a power metal oxide semiconductor field effect transistors (MOSFET) of the n-type. In some embodiments, power transistor 102 may be implemented using transistors of the n-type or p-type including, but not limited to, power MOSFETs, junction field effect transistor (JFETs) high electron mobility transistor (HEMT) such as gallium nitride (GaN) HEMTs and insulated gate bipolar transistors (IGBTs). Alternatively, other transistor types may be used. The selection of which transistor to use may be made according to the specifications, voltage and current levels of the particular application. Appropriate adjustments to soft-start circuit 200 may be made to accommodate the particular device type. For example, when power transistor 102 is of the n-type, a charge pump (not shown) may be used to control the voltage at the control node of power transistor 102.

Power transistor 102, amplifier 104, and ramp generator 202 may be implemented inside an integrated circuit (IC) having a monolithic substrate. In some embodiments, a multi-chip approach may be used.

In some embodiments, amplifier 104 and ramp generator 202 may be implemented in one IC while power transistor 102 may be implemented in a second IC. In some embodiments, the IC having power transistor 102 may be implemented in the same package as the IC having ramp generator 202 and amplifier 104.

Soft-start capacitor 110 and output capacitor 112 may be implemented external to an IC. In some embodiments, a small capacitor in parallel to soft-start capacitor 110 may be integrated into the IC having ramp generator 202.

It is understood that different combinations and level of integrations are possible. Some embodiments may implement ramp generator 202, amplifier 102, power transistor 102, and capacitors 110 and 112 discretely.

Figure 2B:
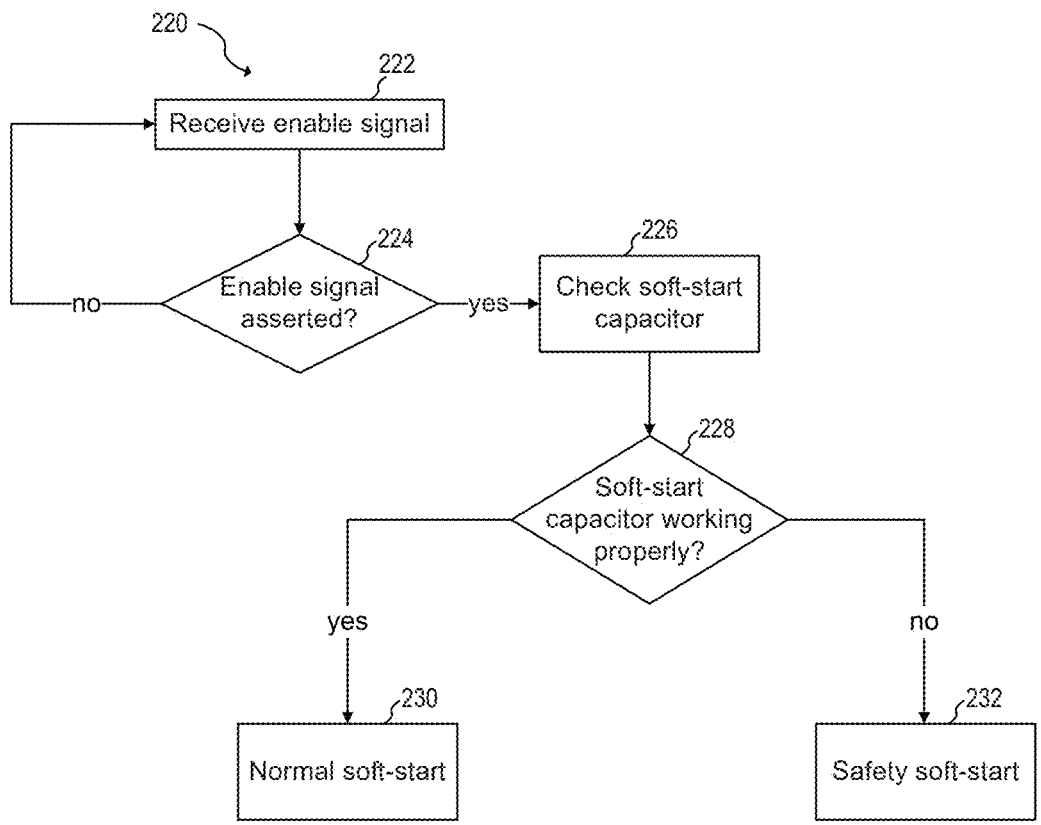
FIG. 2b illustrates a flow chart of an embodiment method of operating a soft-start circuit, according to an embodiment of the present invention.

FIG. 2b illustrates a flow chart of embodiment method 220 of operating a soft-start circuit, according to an embodiment of the present invention. Method 220 may be implemented in soft-start circuit 200. Method 220 may also be implemented in other circuit architectures and in other ways known in the art. The discussion that follows assumes that soft-start circuit 200, as shown in FIG. 2a, implements method 220 of operating a soft-start circuit.

During step 222, a ramp generator, such as ramp generator 202, receives an enable signal. The ramp generator checks whether the enable signal is asserted in step 224. Before the enable signal is asserted, the ramp generator keeps the voltage at node $V_{ramp}$ low. Once the enable signal is asserted, the ramp generator checks whether a soft-start capacitor, such as soft-start capacitor 110, is operating properly in 226 while keeping the voltage at node $V_{ramp}$ low. The soft-start capacitor is malfunctioning if, for example, is disconnected, is improperly soldered, it is damaged, or it has a capacitance below a minimum predetermined capacitance.

If the ramp generator determines in step 228 that the soft-start capacitor is operating properly, a normal ramp is generated at node $V_{ramp}$. The normal ramp may be generated, for example, by injecting a current into the soft-start capacitor.

If the ramp generator determines in step 228 that the soft-start capacitor is malfunctioning, a safety ramp is generated at node $V_{ramp}$. The safety ramp may be generated by pulling up node $V_{ramp}$ with a predetermined safety current. In some embodiment, the safety current charges an internal capacitance (not shown in FIG. 2a) that is coupled to the ramp generator. The internal capacitance is typically much smaller than the external soft-start capacitor.

Advantages of some embodiments include providing over-current protection to electronic devices coupled to a soft-start circuit even when a soft-start capacitor malfunctions (e.g., is disconnected or damaged) or when a wrong capacitor (e.g., a capacitor too small) is installed. Since determining the status of the soft-start capacitor is performed prior to turning on the power transistor, a safe soft-start may be achieved even without monitoring either input $V_{in}$, or output $V_{out}$ and without relying on a fast feedback loop based on input $V_{in}$ or output $V_{out}$.

In some embodiments, the ramp generator determines whether the soft-start capacitor is operating properly by injecting a first current into the soft-start capacitor and comparing the voltage produced across the capacitor after a delay. If the voltage is lower than a predetermined voltage, the ramp generator determines that the soft-start capacitor is operating properly and generates a normal ramp by injecting the first current into the soft-start capacitor. If the voltage is higher than the predetermined voltage, the ramp generator determines that the soft-start capacitor is disconnected or does not have the minimum capacitance, and then generates a safety ramp by injecting a second current smaller than the first current into a soft-start capacitor node that is configured to be coupled to the soft-start capacitor.

Figure 3A:
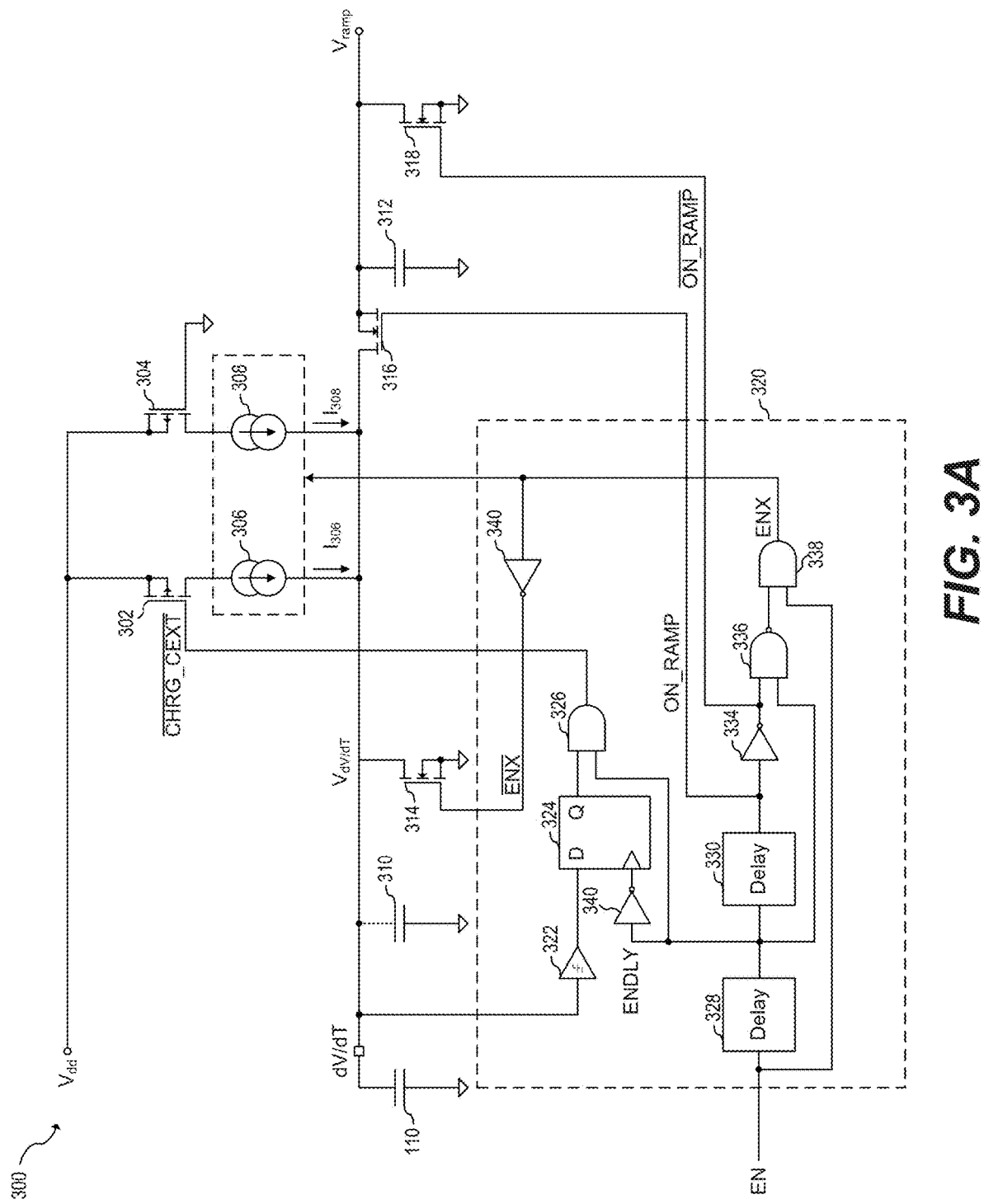
FIG. 3a shows a schematic diagram of a ramp generator, according to an embodiment of the present invention.

FIG. 3a shows a schematic diagram of ramp generator 300, according to an embodiment of the present invention. Ramp generator 300 illustrates a possible implementation of ramp generator 202. Ramp generator 300 includes transistors 302, 304, 314, 316, and 318, capacitors 110, 310, and 312, and logic circuit 320.

FIG. 3a may be understood in view of FIGS. 3b and 3c. FIGS. 3b and 3c show waveforms of ramp generator 300 when soft-start capacitor 110 is properly connected or disconnected, respectively, according to an embodiment of the present invention.

Prior to power-up, enable signal EN is de-asserted (e.g., low), as shown in FIGS. 3b and 3c. Thereby, signal ENX is de-asserted (e.g., low—see AND gate 338), which keep current sources 306 and 308 off and transistor 314 on, signal ENDLY is de-asserted (e.g., low—see delay block 328), signal $\overline{CHRG\_CEXT}$ is asserted (e.g., low—see AND gate 326, which keeps transistor 302 on, signal ON_RAMP is de-asserted (e.g., low—see delay block 330), which keeps transistor 316 off and transistor 318 on. Since transistor 318 is on, the voltage at node $V_{ramp}$ is kept low. Even though transistors 302 and 304 are on prior to power-up, no current is injected into node $V_{dV/dT}$ since current sources 306 and 308 are off.

As shown in FIGS. 3b and 3c, when enable signal EN is asserted (e.g., high), signal ENX is asserted, which turns on current sources 306 and 308. Signal $\overline{ENX}$ is de-asserted (e.g., low—see inverter 340), which turns off transistor 314. Since transistors 314 and 316 are both off, any current injected into node $V_{dV/dT}$ would be injected into soft-start capacitor 110. If soft-start capacitor 110 is properly connected and has sufficient capacitance, the voltage at node $V_{dV/dT}$ would not substantially increase, as shown in FIG. 3b. However, if soft-start capacitor 110 is disconnected or has too little effective capacitance, the voltage at node $V_{dV/dT}$ would increase, as shown in FIG. 3c.

After $delay_{328}$ produced by delay block 328, flip-flop 324 latches the result of comparing the voltage at node $V_{dV/dT}$ with a predetermined threshold using comparator 322. If soft-start capacitor 110 is properly connected and has sufficient capacitance, flip-flop 324 latches a zero, which keeps transistor 302 on, as shown in FIG. 3b. However, if soft-start capacitor 110 is disconnected or has too little effective capacitance, flip-flop 324 latches a one, which turns off transistor 302, as shown in FIG. 3c.

After flip-flop 324 latches the result of the comparison, signal ENX is de-asserted, which turns on transistor 314, as shown in FIGS. 3b and 3c. Turning on transistor 314 ensures that the voltage at node $V_{dV/dT}$ returns to 0 V regardless of whether soft-start capacitor 110 is properly connected or whether soft-start capacitor 110 has sufficient capacitance.

After delay 330 produced by delay block 330, signal ON_RAMP is asserted and signal ENX is asserted again, as shown in FIGS. 3b and 3c. Transistors 314 and 318, therefore, are turned off while transistor 316 is turned on. If soft-start capacitor 110 is properly connected and has sufficient capacitance, current sources 306 and 308 both injecting current into soft-start capacitor 110, thereby producing a soft-start ramp at node $V_{ramp}$, as shown in FIG. 3b. However, if soft-start capacitor 110 is disconnected or has too little effective capacitance, current source 308 is on while current source 306 is off, which inject a substantially smaller current into node $V_{dV/dT}$, thereby producing a voltage ramp at node $V_{ramp}$, as shown in FIG. 3c.

In some embodiments, current $I_{308}$ is substantially smaller than current $I_{306}$. For example, current $I_{308}$ may be 200 times smaller than current $I_{306}$. Lower current ratios, such as 100 or less may be used. Higher current ratios, such as 500 or more, are also possible. AS a non-limiting example, current $I_{306}$ may be 6 uA while current $I_{308}$ may be 30 nA. Other values are also possible.

Since current $I_{308}$ is relatively small, and the slope of the voltage ramp produced at node $V_{ramp}$ when soft-start capacitor 110 is malfunctioning is based on the amount of current injected and any capacitance (e.g., parasitic capacitance) coupled to node $V_{dV/dT}$, some embodiments may include capacitor 312, in part, to decrease the slope (i.e., slow down the voltage ramp) of the safety ramp produced when soft-start capacitor 110 is disconnected. Capacitor 312 is typically substantially smaller than soft-start capacitor 110. In some embodiments, capacitor 312 is 1000 times smaller than soft-start capacitor 110. Lower capacitance ratios, such as 500 or less may be used. Higher capacitance ratios, such as 2000 or more, are also possible. As a non-limiting example, in some embodiments, soft-start capacitor 110 may have a capacitance higher than 100 nF, such as 200 nF, and the capacitor 312 may have a capacitance below 100 pF, such as 30 pF. Some embodiments may include optional capacitor 310 coupled to node $V_{dV/dT}$ to perform similar functions as capacitor 312.

The capacitance of soft-start capacitor 110, and the minimum capacitance of soft-start capacitor 110, may be determined in conjunction with the magnitude of current $I_{306}$. The combination of the capacitance of capacitor 110 and the value of current $I_{306}$ may determine the duration of the ramp, thereby determining the duration of the soft-start.

In some embodiments, changing the capacitance of soft-start capacitor 110 changes the duration of the soft-start. For example, in some embodiments, the higher the capacitance of soft-start capacitor 110, the lower the slope of the voltage ramp and, therefore, the longer the soft-start duration.

The minimum capacitance may be determined as the capacitance that produces the fastest safe soft-start. In some embodiments, the minimum capacitance is selected as near 0 pF or slightly above the capacitance of the terminal dV/dT without soft-start capacitor 110. In such embodiments, ramp generator 300 detects if a soft-start capacitor 110 is properly connected without detecting if soft-start capacitor 110 has a safe capacitance.

Delay blocks 328 and 330 may be implemented in any way known in the art. For example, delay blocks 328 and 330 may be implemented digitally with counters. Alternatively, delay blocks 328 and 330 may be implemented with resistors and capacitances. Other implementations are also possible.

The duration of delay 328 and delay 330 may be selected to be substantially smaller than the duration of the voltage ramp generated when soft-start capacitor 110 is properly connected. For example, if a typical duration of the voltage ramp when soft-start capacitor 110 is properly connected is 10 ms, the duration of each of delay 328 and delay 330 may be between 2 us and 3 us. In some embodiments, delay 328 and delay 330 have the same duration. In other embodiments, the duration of delay 328 and delay 330 may be different. Delays lower than 2 us and higher than 3 us are also possible.

Logic circuit 320 may be implemented in any way known in the art. For example, logic circuit 320 may be implemented as shown in FIG. 320. Logic circuit 320 may also be implemented by using VHDL and automatically generating a digital circuit performing the functions described herein. Other implementations are also possible.

Transistors 314, 316 and 318 may be complementary metal-oxide-semiconductor (CMOS) transistors of the n-type and transistors 302 and 304 may be CMOS transistors of the p-type. In some embodiments, transistor 302, 304, 314, 316 and 318, may be implemented using transistors of the n-type or p-type including, but not limited to, CMOS transistors, bipolar complementary metal-oxide-semiconductor (BiCMOS) transistors, double diffused MOS (DMOS) transistors, lateral DMOS (LDMOS) transistors, and transistors implemented using bipolar, CMOS, DMOS (BCD) technology, such as BCD8 smart power (BVD8sp) technology. The selection of which transistor to use may be made according to the specifications, speed, voltage and current levels of the particular application. Appropriate adjustments to ramp generator 300 may be made to accommodate the particular device type.

Comparator 322 may be implemented without hysteresis. Some embodiments, may implement comparator 322 with hysteresis, such as a Schmitt trigger.

Figure 3D:
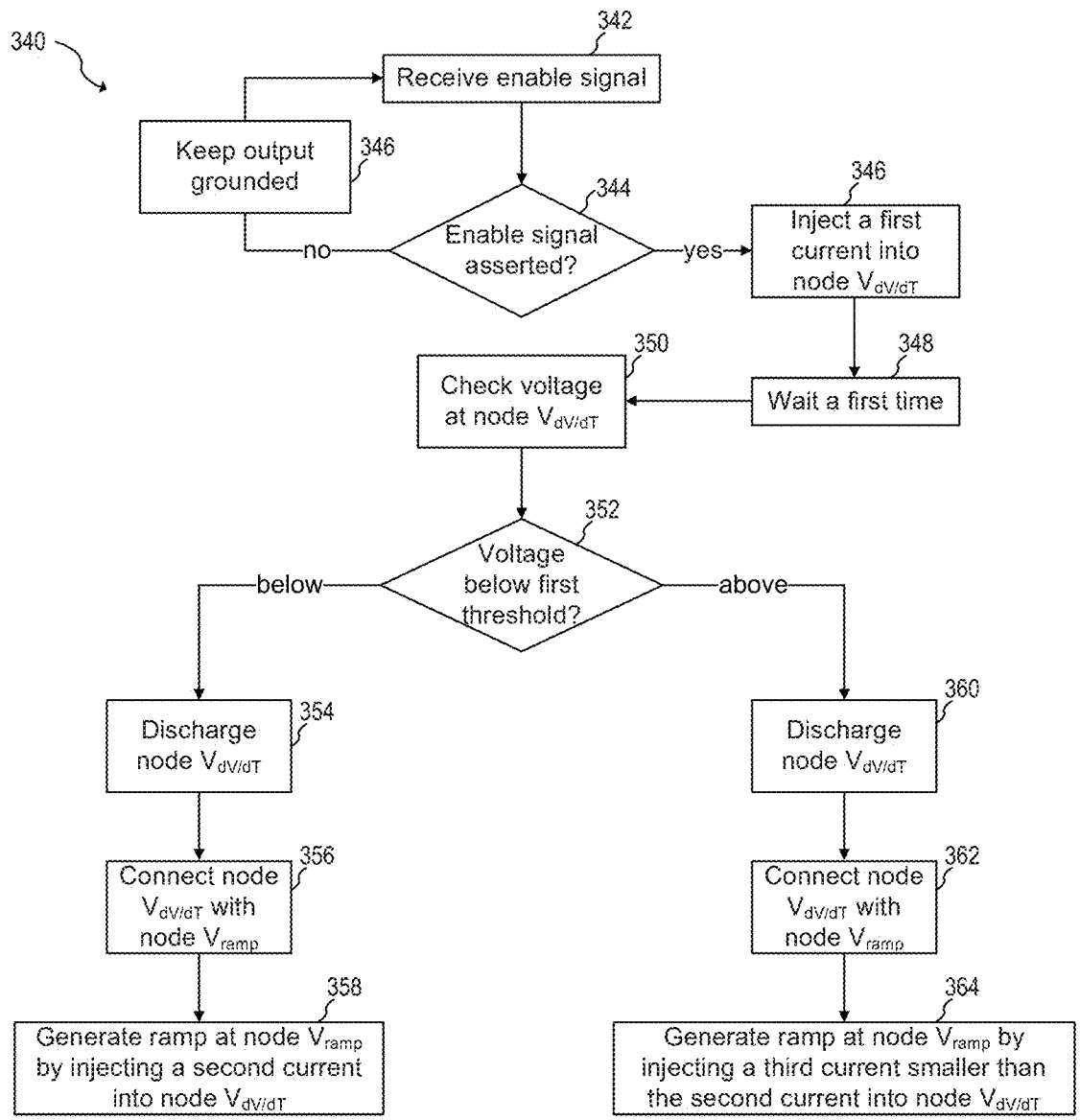
FIG. 3d illustrates a flow chart of an embodiment method of operating a ramp generator, according to an embodiment of the present invention.

FIG. 3d illustrates a flow chart of embodiment method 340 of operating a ramp generator, according to an embodiment of the present invention. Method 340 may be implemented in ramp generator 300. Method 340 may also be implemented in other circuit architectures and in other ways known in the art. The discussion that follows assumes that ramp generator 300, as illustrated in FIGS. 3a-3c, implements method 340 of operating a ramp generator.

During step 342, a ramp generator, such as ramp generator 300, receives an enable signal. The ramp generator checks whether the enable signal is asserted in step 344. Before the enable signal is asserted, the ramp generator keeps the output of the ramp generator, such as node $V_{ramp}$, low, as shown in step 346. Once the enable signal is asserted, the ramp generator injects first current into a node configured to be coupled to a soft-start capacitor, such as node $V_{dV/dT}$, as shown in step 346.

After waiting a first time, as shown in step 348, the ramp generator checks the voltage at node $V_{dV/dT}$ and compares it with a first threshold with, for example, a comparator such as comparator 322, as shown in steps 350 and 352. If the voltage is below the first threshold, node $V_{dV/dT}$ is discharged, node $V_{dV/dT}$ is connected to the output of the ramp generator, and a second current is injected into node $V_{dV/dT}$, which generates a voltage ramp at the output of the ramp generator, as shown in steps 354, 356, and 358. If the voltage is above the first threshold, node $V_{dV/dT}$ is discharged, node $V_{dV/dT}$ is connected to the output of the ramp generator, and a third current smaller than the second current is injected into node $V_{dV/dT}$, which generates a voltage ramp at the output of the ramp generator, as shown in steps 360, 362, and 364.

The third current is typically significantly smaller than the second current. In some embodiments, the second current may be, for example, 200 times smaller than the second current. In some embodiments, the second current may be equal to the first current. In other embodiments, the second current may be different than the first current.

Advantages of some embodiments include generating a soft-start ramp having a substantially constant slope.

Figure 4:
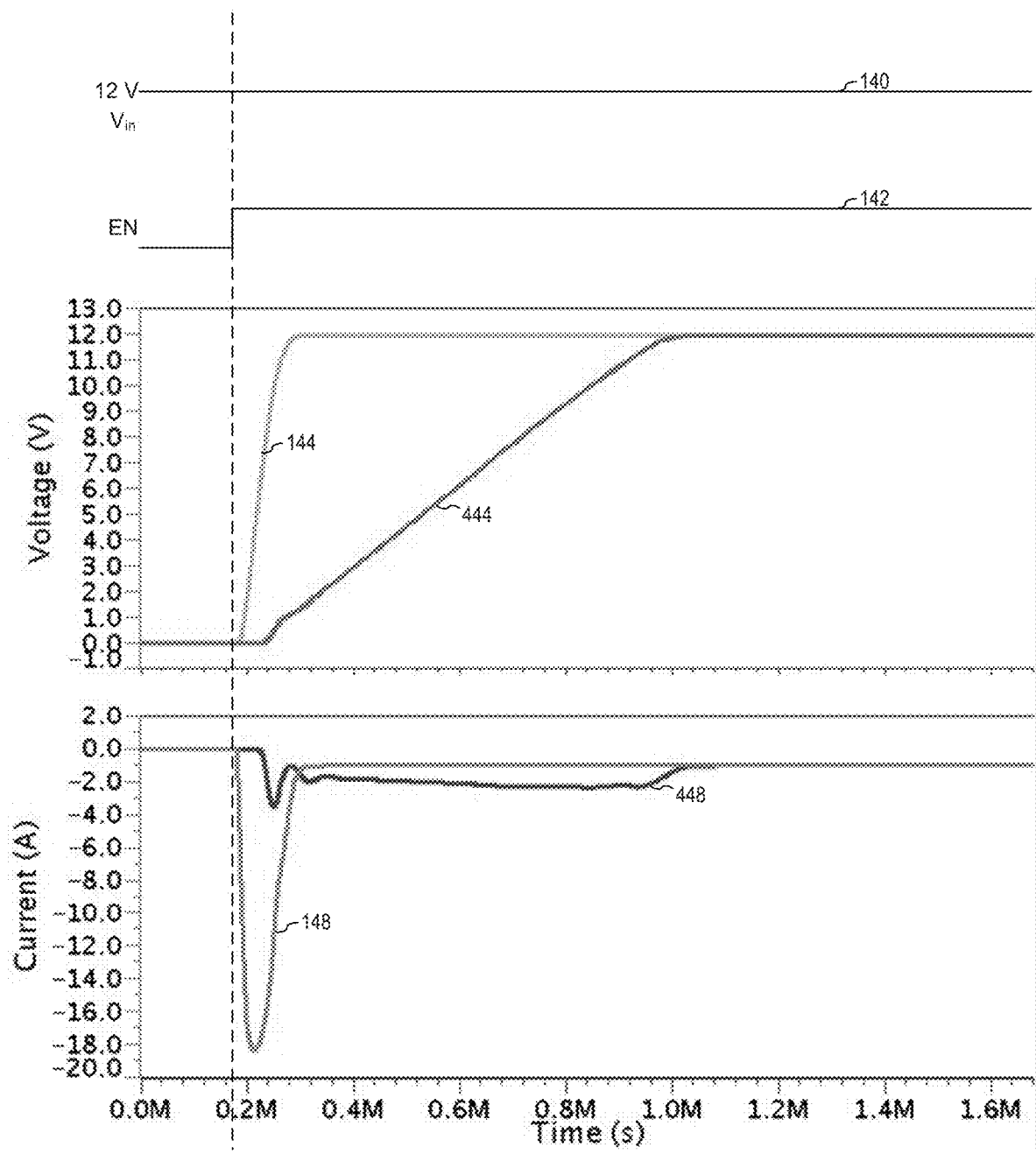
FIG. 4 shows waveforms during a power-up of a soft-start circuit without a soft-start capacitor with and without the ramp generator of FIG. 3a, according to an embodiment of the present invention.

FIG. 4 shows waveforms during a power-up of a soft-start circuit without a soft-start capacitor with and without ramp generator 300, according to an embodiment of the present invention. As shown in FIG. 4, when soft-start capacitor 110 is disconnected, a soft-start circuit implementing ramp generator 300 produces a ramp (see curve 444) that has a substantially constant slope that is smaller than the slope of the ramp produced without ramp generator 300 (see ramp 144). In particular, the voltage slope without soft-start capacitor in a circuit having ramp generator has a duration of about 1 ms (in this example) compared to the about 0.3 ms duration of the voltage slope of the circuit without ramp generator 300. As a result, an in-rush current spike observed in the soft-start circuit having ramp generator 300 (see curve 448) is much smaller than the in-rush current spike observed in the soft-start circuit without ramp generator 300 (see curve 148).

One general aspect includes a method including: receiving an enable signal; after the enable signal is asserted, determining whether a soft-start capacitor is electrically connected to an input of a ramp generator circuit while keeping an output of the ramp generator circuit low; if the soft-start capacitor is electrically connected to the input of the ramp generator circuit, injecting a first current into the input of the ramp generator circuit to generate a first voltage ramp at the output of the ramp generator circuit; and if the soft-start capacitor is not electrically connected to the input of the ramp generator circuit, injecting a second current to the input of the ramp generator circuit to generate a second voltage ramp at the output of the ramp generator circuit, the second current being smaller than the first current.

Implementations may include one or more of the following features. The method where determining whether the soft-start capacitor is electrically connect to the input of the ramp generator circuit includes determining a capacitance of the soft-start capacitor, and comparing the capacitance with a predetermined minimum capacitance. The method where determining the capacitance of the soft-start capacitor includes injecting the first current into the input of the ramp generator circuit, and where comparing the capacitance with the predetermined minimum capacitance includes comparing a voltage at the input of the ramp generator circuit with a first voltage threshold a first time after beginning to inject the first current. The method where the first time includes a time between 2 us and 3 us. The method where the second voltage ramp has a duration smaller than a duration of the first voltage ramp. The method where keeping the output of the ramp generator circuit low includes turning on a first transistor coupled between the output of the ramp generator circuit and a ground terminal, and isolating the input of the ramp generator circuit from the output of the ramp generator circuit by turning off a second transistor. The method where generating the second voltage ramp includes turning off the first transistor and turning on the second transistor coupled between the input of the ramp generator circuit and the output of the ramp generator circuit.

Another general aspect includes a circuit including: an amplifier having an output configured to be coupled to a control terminal of a power switch; and a ramp generator circuit having an output coupled to the amplifier and an input configured to be coupled to a soft-start capacitor, where the ramp generator circuit is configured to determine whether the soft-start capacitor is electrically connected to the ramp generator circuit while keeping the output of the ramp generator circuit at a first voltage, if the ramp generator circuit determines that the soft-start capacitor is electrically connected to the ramp generator circuit and the soft-start capacitor has a capacitance above a first capacitance, inject a first current into the input of the ramp generator circuit to generate a first voltage ramp at the output of the ramp generator circuit, the first voltage ramp starting at the first voltage and ending at a second voltage, and if the ramp generator circuit determines that the soft-start capacitor is electrically not connected from the ramp generator circuit or the soft-start capacitor has a capacitance below the first capacitance, inject a second current to the input of the ramp generator circuit to generate a second voltage ramp at the output of the ramp generator circuit, the second current being smaller than the first current, the second voltage ramp starting at the first voltage and ending at the second voltage.

Implementations may include one or more of the following features. The circuit where the second voltage is higher than the first voltage. The circuit further including a first capacitor coupled to the input of the ramp generator circuit, where pulling-up the output of the ramp generator circuit includes injecting the second current into the first capacitor. The circuit where the soft-start capacitor has a capacitance above 100 nF and the first capacitor has a capacitance below 100 pF. The circuit where the ramp generator circuit is configured to generate a ramp with substantially constant slope at the output of the ramp generator circuit when pulling-up the output of the ramp generator circuit with the second current. The circuit further including the power switch. The circuit where the power switch includes a power metal oxide semiconductor field effect transistors (MOSFET). The circuit where the ramp generator circuit and the power switch are integrated in the same package. The circuit where the ramp generator circuit and the power switch are integrated in the same substrate of an integrated circuit (IC). The circuit where the soft-start capacitor is external to the package. The circuit where the ramp generator circuit includes: a first current source coupled to the input of the ramp generator circuit; a second current source coupled to the input of the ramp generator circuit; a first transistor coupled between the input of the ramp generator circuit and a ground terminal; a second transistor coupled between the input of the ramp generator circuit and the output of the ramp generator circuit; a third transistor coupled between the output of the ramp generator circuit and the ground terminal; and a logic circuit configured to control the first, second and third transistors and further configured to control the first and second current sources. The circuit where determining whether the soft-start capacitor is electrically connected to the ramp generator circuit includes injecting a current produced by the first current source into the input of the ramp generator circuit. The circuit where keeping the output of the ramp generator circuit at the first voltage includes keeping the third transistor on. The circuit where: the first current includes a current produced by the first current source; and the second current includes a current produced by the second current source. The circuit where the ramp generator circuit further includes a fourth transistor in series with the first current source and a fifth transistor in series with the second current source, where the logic circuit is configured to: control the first current source by controlling the fourth transistor; and control the second current source by controlling the fifth transistor.

Yet another general aspect includes an electronic fuse (e-fuse) including: an input terminal; an output terminal; a power transistor coupled between the input terminal and the output terminal; an amplifier having an output coupled to a control terminal of the power transistor and having a first input coupled to the power transistor via a feedback network; and a ramp generator circuit having an output coupled to the amplifier and an input configured to be coupled to a soft-start capacitor, where the ramp generator circuit is configured to determine whether the soft-start capacitor is electrically connected to the input of the ramp generator circuit while keeping the output of the ramp generator circuit low, if the ramp generator circuit determines that the soft-start capacitor is electrically connected to the input of the ramp generator circuit and a capacitance of the soft-start capacitor is above a first capacitance, inject a first current into the soft-start capacitor, and if the ramp generator circuit determines that the soft-start capacitor is electrically not connected from the ramp generator circuit or the capacitance of the soft-start capacitor is below the first capacitance, pull-up the output of the ramp generator circuit with a second current, the second current being smaller than the first current.

Implementations may include one or more of the following features. The e-fuse where the e-fuse is implemented inside a power management integrated circuit (PMIC). The e-fuse where the ramp generator circuit includes: a first current source coupled to the input of the ramp generator circuit; a second current source coupled to the input of the ramp generator circuit; a first transistor coupled between the input of the ramp generator circuit and a ground terminal; a second transistor coupled between the input of the ramp generator circuit and the output of the ramp generator circuit; a third transistor coupled between the output of the ramp generator circuit and the ground terminal; and a logic circuit configured to control the first, second and third transistors and further configured to control the first and second current sources. The e-fuse where pulling up the output of the ramp generator circuit includes turning on the second transistor and turning off the third transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
receiving an enable signal with a first circuit;
after the enable signal is asserted, injecting a first current into a first input terminal of the first circuit;
after injecting the first current into the first input terminal, comparing a first voltage at the first input terminal with a first threshold;
when the first voltage is higher than the first threshold, generating a first voltage ramp at an output of the first circuit; and
when the first voltage is lower than the first threshold, generating a second voltage ramp at the output of the first circuit, the second voltage ramp being slower than the first voltage ramp.

2. The method of claim 1, further comprising grounding the output of the first circuit when the enable signal is de-asserted.

3. The method of claim 1, wherein generating the second voltage ramp comprises injecting a second current into the first input terminal, the second current being smaller than the first current.

4. The method of claim 1, further comprising discharging the first input terminal after comparing the first voltage with the first threshold and before generating the first voltage ramp or the second voltage ramp.

5. The method of claim 1, further comprising, when the first voltage is lower than the first threshold, connecting the first input terminal to the output of the first circuit before generating the second voltage ramp.

6. The method of claim 5, wherein connecting the first input terminal to the output of the first circuit comprises turning on a first transistor coupled between a current source and the output of the first circuit.

7. The method of claim 1, wherein comparing the first voltage at the first input terminal with the first threshold comprises comparing the first voltage at the first input terminal with the first threshold a first time after injecting the first current into the first input terminal, the first time comprising a time between 2 μs and 3 μs.

8. An electronic fuse (e-fuse) comprising:
an input terminal;
an output terminal;
a power transistor coupled between the input terminal and the output terminal;
an amplifier having an output coupled to a control terminal of the power transistor and having a first input coupled to the power transistor; and
a ramp generator circuit having an output coupled to the amplifier, wherein the ramp generator circuit is configured to:
receive an enable signal,
after the enable signal is asserted, inject a first current into a first input of the ramp generator circuit;
after injecting the first current into the first input of the ramp generator circuit, compare a first voltage at the first input of the ramp generator circuit with a first threshold;
when the first voltage is higher than the first threshold, generate a first voltage ramp at the output of the ramp generator circuit; and
when the first voltage is lower than the first threshold, generate a second voltage ramp at the output of the ramp generator circuit, the second voltage ramp being slower than the first voltage ramp.

9. The e-fuse of claim 8, wherein the ramp generator circuit is configured to ground the output of the ramp generator circuit when the enable signal is de-asserted.

10. The e-fuse of claim 8, wherein the ramp generator circuit is configured to generate the second voltage ramp by injecting a second current into the first input of the ramp generator circuit, the second current being smaller than the first current.

11. The e-fuse of claim 8, wherein the ramp generator circuit is further configured to discharge the first input of the ramp generator circuit after comparing the first voltage with the first threshold and before generating the first voltage ramp or the second voltage ramp.

12. The e-fuse of claim 8, wherein the ramp generator circuit further comprises:
- a first current source coupled between a first supply terminal and the first input of the ramp generator circuit;
- a first transistor coupled between the first input of the ramp generator circuit and a second supply terminal;
- a second transistor coupled between the first input of the ramp generator circuit and the output of the ramp generator circuit;
- a third transistor coupled between the output of the ramp generator circuit and the second supply terminal; and
- a logic circuit configured to control the first, second and third transistors and further configured to control the first current source.

13. The e-fuse of claim 12, wherein the logic circuit comprises:
- a first delay circuit configured to receive the enable signal;
- a second delay circuit coupled to the first delay circuit and having an output coupled to the second transistor;
- a comparator having an input coupled to the first input of the ramp generator circuit; and
- a flip-flop having a first input coupled an output of the comparator, a second input coupled to the first delay circuit, and an output configured to control the first current source.

14. The e-fuse of claim 13, wherein the first delay circuit is configured to produce a delay between 2 µs and 3 µs, and wherein the second delay circuit is configured to produce a delay between 2 µs and 3 µs.

15. The e-fuse of claim 12, wherein the ramp generator circuit is configured to ground the output of the ramp generator circuit by turning on the third transistor.

16. The e-fuse of claim 12, wherein the ramp generator circuit is configured to discharge the first input of the ramp generator circuit by turning on the first transistor.

17. The e-fuse of claim 12, wherein the ramp generator circuit is configured to connect the first input to the output of the ramp generator circuit before generating the second voltage ramp by turning on the second transistor.

18. A method comprising:
- receiving an enable signal with a first circuit;
- grounding an output of the first circuit when the enable signal is de-asserted;
- after the enable signal is asserted, injecting a first current into a first input terminal of the first circuit;
- after injecting the first current into the first input terminal, comparing a first voltage at the first input terminal with a first threshold;
- when the first voltage is higher than the first threshold, generating a first voltage ramp at the output of the first circuit; and
- when the first voltage is lower than the first threshold, generating a second voltage ramp at the output of the first circuit, the second voltage ramp being slower than the first voltage ramp, wherein generating the second voltage ramp comprises injecting a second current into the first input terminal, the second current being smaller than the first current.

19. The method of claim 18, further comprising discharging the first input terminal after comparing the first voltage with the first threshold and before generating the first voltage ramp or the second voltage ramp.

20. The method of claim 18, further comprising further comprising, when the first voltage is lower than the first threshold, connecting the first input terminal to the output of the first circuit before generating the second voltage ramp.

21. The method of claim 18, wherein comparing the first voltage at the first input terminal with the first threshold comprises comparing the first voltage at the first input terminal with the first threshold a first time after injecting the first current into the first input terminal, the first time comprising a time between 2 µs and 3 µs.

* * * * *

UNITED STATES PATENT AND TRADEMARK OFFICE
CERTIFICATE OF CORRECTION

PATENT NO. : 10,673,422 B2
APPLICATION NO. : 16/254839
DATED : June 2, 2020
INVENTOR(S) : Marco Martini It is certified that error appears in the above-identified patent and that said Letters Patent is hereby corrected as shown below:

In the Claims

In Column 14, Lines 27-28, Claim 20, delete "further comprising further comprising" and insert --further comprising--.

Signed and Sealed this
Eighth Day of September, 2020

Andrei Iancu
*Director of the United States Patent and Trademark Office*